(12) United States Patent
Lunk et al.

(10) Patent No.: US 7,989,064 B2
(45) Date of Patent: Aug. 2, 2011

(54) CERAMIC-COATED TUNGSTEN POWDER

(75) Inventors: Hans-Joachim Lunk, Towanda, PA (US); Ricky D. Morgan, Milan, PA (US); Henry J. Stevens, Athens, PA (US); Dale E. Benjamin, Athens, PA (US); Tuan A. Dang, Sayre, PA (US); Timothy A. Frisk, Towanda, PA (US)

(73) Assignee: Global Tungsten & Powders Corp., Towanda, PA (US)

( * ) Notice: Subject to any disclaimer, the term of this patent is extended or adjusted under 35 U.S.C. 154(b) by 0 days.

(21) Appl. No.: 11/306,706

(22) Filed: Jan. 9, 2006

(65) Prior Publication Data

US 2006/0199001 A1 Sep. 7, 2006

Related U.S. Application Data

(60) Provisional application No. 60/593,534, filed on Jan. 24, 2005.

(51) Int. Cl.
B32B 5/16 (2006.01)
(52) U.S. Cl. ........................ 428/403; 428/404
(58) Field of Classification Search ........... 428/403–407
See application file for complete search history.

(56) References Cited

U.S. PATENT DOCUMENTS

| | | | | |
|---|---|---|---|---|
| 2,057,604 | A | 10/1936 | Zickrick | 200/166 |
| 3,372,107 | A | 3/1968 | Klein | 204/291 |
| 3,475,159 | A | 10/1969 | Hansen | 75/0.5 |
| 4,083,922 | A | 4/1978 | Kassera | 423/56 |
| 4,315,777 | A | 2/1982 | Nadkarni et al. | 75/232 |
| 4,397,821 | A | 8/1983 | Beckstead et al. | 423/58 |
| 4,493,789 | A * | 1/1985 | Ueyama et al. | 252/514 |
| 4,800,316 | A | 1/1989 | Ju-Zhen | 310/327 |
| 5,070,591 | A * | 12/1991 | Quick et al. | 29/527.4 |
| 5,080,928 | A | 1/1992 | Klinedinst et al. | |
| 5,184,662 | A * | 2/1993 | Quick et al. | 164/97 |
| 5,200,271 | A | 4/1993 | Kosaka | 428/457 |
| 5,220,243 | A * | 6/1993 | Klinedinst et al. | 313/502 |
| 5,244,750 | A | 9/1993 | Reilly et al. | |
| 5,279,787 | A | 1/1994 | Oltrogge | 419/38 |
| 5,348,920 | A * | 9/1994 | Sugimoto et al. | 501/153 |
| 5,656,791 | A | 8/1997 | Reese et al. | 102/307 |
| 5,760,331 | A | 6/1998 | Lowden et al. | 102/506 |
| 5,874,056 | A | 2/1999 | Beudssus et al. | 423/61 |
| 5,887,437 | A | 3/1999 | Maxim | 62/4 |
| 5,913,256 | A | 6/1999 | Lowden et al. | 75/248 |
| 5,958,125 | A * | 9/1999 | Schmid et al. | 106/417 |
| 5,963,776 | A | 10/1999 | Lowden et al. | 419/64 |
| 6,064,150 | A | 5/2000 | Klinedinst et al. | |
| 6,254,757 | B1 * | 7/2001 | Lashmore et al. | 205/149 |
| 6,309,700 | B1 | 10/2001 | Fan et al. | |
| 6,823,798 | B2 | 11/2004 | Amick | 102/517 |
| 6,986,914 | B2 * | 1/2006 | Elers et al. | 427/255.23 |
| 7,329,590 | B2 * | 2/2008 | Elers et al. | 438/473 |
| 2003/0056620 | A1 | 3/2003 | Siddle et al. | 75/248 |
| 2004/0177720 | A1 | 9/2004 | Shaner et al. | 75/248 |
| 2006/0196585 | A1 | 9/2006 | Lunk et al. | 148/423 |

FOREIGN PATENT DOCUMENTS

| | | |
|---|---|---|
| DE | 78315 | 2/1893 |
| EP | 0 279 454 | 8/1988 |
| EP | 0 774 315 A2 | 5/1997 |
| EP | 0774315 A2 * | 5/1997 |
| EP | 1 690 616 | 6/2008 |
| EP | 1 683 878 | 9/2008 |
| JP | 54-080208 | 6/1979 |
| JP | 59-170206 | 3/1983 |
| JP | 62-230622 | 10/1987 |
| JP | 62-239622 | 10/1987 |
| JP | 62-286698 | 12/1987 |
| JP | 53-20943 | 5/1992 |
| JP | XP002380826 | * 11/1995 |
| JP | 2002-332505 | 11/2002 |
| JP | 2003-211144 | 7/2003 |

OTHER PUBLICATIONS

Abstract XP-002380826, Itagaki Takehiko, Coating of HfC on tungsten powder by fluidized bed CVD, Nov. 1995.
U.S. Appl. No. 11/306,704, filed Jan. 9, 2006, Lunk et al., Non-Final Office Action, Jul. 7, 2008.
U.S. Appl. No. 11/306,704, filed Jan. 9, 2006, Lunk et al., Response to Non-Final Office Action, Dec. 8, 2008.
U.S. Appl. No. 11/306,704, filed Jan. 9, 2006, Lunk et al., Final Office Action, Feb. 24, 2009.
U.S. Appl. No. 11/306,704, filed Jan. 9, 2006, Lunk et al., Response to Final Office Action, May 26, 2009.
U.S. Appl. No. 11/306,704, filed Jan. 9, 2006, Lunk et al., Request for Continued Examination, May 26, 2009.
U.S. Appl. No. 11/306,704, filed Jan. 9, 2006, Lunk et al., Non-Final Office Action, Jun. 9, 2009.
U.S. Appl. No. 11/306,704, filed Jan. 9, 2006, Lunk et al., Response to Non-Final Office Action, Dec. 9, 2009.
U.S. Appl. No. 11/306,705, filed Jan. 9, 2006, Lunk et al., Non-Final Office Action, Mar. 20, 2008.
U.S. Appl. No. 11/306,705, filed Jan. 9, 2006, Lunk et al., Response to Non-Final Office Action, Jun. 13, 2008.
U.S. Appl. No. 11/306,705, filed Jan. 9, 2006, Lunk et al., Final Office Action, Sep. 16, 2008.
U.S. Appl. No. 11/306,705, filed Jan. 9, 2006, Lunk et al., Response to Final Office Action, Mar. 16, 2009.
U.S. Appl. No. 11/306,705, filed Jan. 9, 2006, Lunk et al., Request for Continued Examination, Mar. 16, 2009.
U.S. Appl. No. 11/306,705, filed Jan. 9, 2006, Lunk et al., Non-Final Office Action, Jun. 1, 2009.
U.S. Appl. No. 11/306,705, filed Jan. 9, 2006, Lunk et al., Response to Non-Final Office Action, Dec. 1, 2009.

(Continued)

*Primary Examiner* — Leszek Kiliman
(74) *Attorney, Agent, or Firm* — Ballard Spahr LLP

(57) ABSTRACT

The coating the tungsten powder particles with a ceramic barrier suppresses the leachability of tungsten in aqueous media. Preferably, the ceramic coating substantially encapsulates each particle of tungsten and has a thickness of at least about 30 nm and, more preferable, from about 200 nm to about 500 nm. Examples of ceramic coatings that may be used include, but are not limited to, aluminum oxide (alumina), aluminum oxyhydroxide (AlOOH), zirconium oxide (zirconia), cerium oxide (ceria), hafnium oxide (hafnia), and magnesium oxide (magnesia).

6 Claims, No Drawings

OTHER PUBLICATIONS 06001441.2, Jan. 24, 2006, Lunk et al., European Search Report, Aug. 1, 2006.
06001441.2, Jan. 24, 2006, Lunk et al., Communication from the European Patent Office, Apr. 16, 2007.
06001441.2, Jan. 24, 2006, Lunk et al., Response to Communication from the European Patent Office, Jul. 19, 2007.
06001441.2, Jan. 24, 2006, Lunk et al., Intent to Grant, Mar. 25, 2008.
06001441.2, Jan. 24, 2006, Lunk et al., Decision to Grant, Aug. 21, 2008.
06001442.0, Jan. 24, 2006, Lunk et al., European Search Report, Aug. 1, 2006.
06001442.0, Jan. 24, 2006, Lunk et al., Communication from the European Patent Office, Mar. 5, 2008.
06001442.0, Jan. 24, 2006, Lunk et al., Response to Communication from the European Patent Office, Mar. 28, 2008.
06001442.0, Jan. 24, 2006, Lunk et al., Communication from the European Patent Office, Jun. 3, 2008.
06001442.0, Jan. 24, 2006, Lunk et al., Response to Communication from the European Patent Office, Nov. 26, 2008.
06001442.0, Jan. 24, 2006, Lunk et al., Intent to Grant, May 13, 2009.
06001442.0, Jan. 24, 2006, Lunk et al., Decision to Grant, Oct. 29, 2009.
06001432.1, Jan. 24, 2006, Lunk et al., European Search Report, Dec. 21, 2006.
06001432.1, Jan. 24, 2006, Lunk et al., Communication from the European Patent Office, Aug. 9, 2007.
06001432.1, Jan. 24, 2006, Lunk et al., Response to Communication from the European Patent Office, Nov. 16, 2007.
06001432.1, Jan. 24, 2006, Lunk et al., Intent to Grant, Jan. 2, 2008.
06001432.1, Jan. 24, 2006, Lunk et al., Decision to Grant, May 29, 2008.

* cited by examiner

CERAMIC-COATED TUNGSTEN POWDER

CROSS REFERENCE TO RELATED APPLICATION

This application claims the benefit of U.S. Provisional Application No. 60/593,534, filed Jan. 24, 2005.

BACKGROUND OF THE INVENTION

The use of tungsten powder or pressed tungsten powder compacts in pure or mixtures with other powders under natural conditions in the presence of water and oxygen (e.g., air or dissolved oxygen) leads to the formation of a water-soluble, tungsten-containing species. The first step of the reaction can be described as follows:

$$W+H_2O+1.5O_2 \rightarrow WO_4^{2-}+2H^+.$$

The monotungstate ion, $WO_4^{2-}$, reacts with $H^+$, resulting in the formation of the soluble metatungstate anion $[H_2W_{12}O_{40}]^{6-}$:

$$12WO_4^{2-}+18H^+ \rightarrow [H_2W_{12}O_{40}]^{6-}+8H_2O.$$

The formation of this polyoxometalate anion is detectable by its typical UV absorption maximum at 256 nm (molar extinction coefficient, $\epsilon_{256}=3.8\times10^4$ L(mol·cm)$^{-1}$).

SUMMARY OF THE INVENTION

By coating the tungsten powder particles with a ceramic barrier such as alumina, the leachability of tungsten is prevented or greatly reduced. Preferably, the ceramic coating substantially encapsulates each particle of tungsten and has a thickness of at least about 30 nm and, more preferable, from about 200 nm to about 500 nm. Examples of ceramic coatings that may be used include, but are not limited to, aluminum oxide (alumina), aluminum oxyhydroxide (AlOOH), zirconium oxide (zirconia), cerium oxide (ceria), hafnium oxide (hafnia), and magnesium oxide (magnesia). Preferably, the coating is applied in a fluidized bed of tungsten particles using a chemical vapor deposition (CVD) reaction. Similar methods have been used for coating phosphor particles. Examples of these methods are described in U.S. Pat. Nos. 5,220,243, 5,244,750, 6,309,700, and 6,064,150.

DETAILED DESCRIPTION OF THE INVENTION

For a better understanding of the present invention, together with other and further objects, advantages and capabilities thereof, reference is made to the following disclosure and appended claims.

A spheroidized tungsten powder of (particle size >3 micrometers) was coated with a ceramic material in a fluidized bed reactor using a CVD reaction of trimethylaluminum (TMA) and water vapor. The hydrolyzed TMA coating and CVD process are described in U.S. Pat. Nos. 5,080,928 and 5,220,243 which are incorporated herein by reference. The hydrolyzed TMA coating is believed to be an aluminum oxyhydroxide, but may be varied in composition between aluminum oxide and aluminum hydroxide depending upon the reaction conditions. The CVD reaction can be described as follows:

$$Al(CH_3)_3+(3+n)/2H_2O \rightarrow AlO_{(3-n)/2}(OH)_n+3CH_4$$
$$(0 \leq n \leq 3)$$

The tungsten particles were coated in the fluidized bed reactor for various lengths of time (from 0.5 hours to 3.5 hours) in order to produce coating thicknesses from 30 nm-500 nm.

Coated and uncoated tungsten powders were subjected to a leach test performed in an aqueous buffer solution. The buffer solution having a pH of 7.2 was prepared by dissolving 4.03 mg KCl, 50.6 mg CaSO$_4$.2H$_2$O, 123.2 mg MgSO$_4$.7H$_2$O, 96.0 mg NaHCO$_3$, and 209.3 mg of a noncomplexing tertiary amine, 3-(N-morpholino) propanesulfonic acid (MOPS) per liter of water. Ten-gram amounts of the powders were added to 500-ml volumes of the aqueous buffer solution in 1-liter NALGENE© (PP) Erlenmeyer flasks.

The 1-liter flasks containing the samples were loosely covered with an aluminum foil and continuously shaken in a dark, thermostated room (72° F.) with a LAB-LINE® Force orbital open air shaker, Model 4690, for a period of 28 days. Periodic 25-ml samples of the leachate solutions were taken and analyzed for pH, oxygen content, and tungsten content at 7, 14, 21, and 28 days. A constant oxygen concentration of 8.3±0.2 mg/liter was observed for the entire testing period of 28 days.

The results of the leach tests are shown in Table I. Coating thickness was determined using a sputtering rate of approximately 0.1 nm/s (based on a tantalum oxide depth-profiling standard). The completeness of the ceramic coating on the particles was evaluated using x-ray photoelectron spectroscopy by observing the attenuation of the tungsten photoelectron peak. In each case, the coating attenuated the W signal by at least 99% indicating that the coating substantially encapsulated the individual tungsten particles.

As can be seen, the amount of tungsten in the leachate of the uncoated spheroidized tungsten powder (uncoated control) increases from 0.43% of the initial tungsten amount at 7 days to 0.75% at 28 days. Whereas, in all cases, the ceramic coating suppressed the leachability of tungsten as compared to the uncoated control and in fact the amount of leached tungsten becomes almost undetectable as coating thickness increases.

TABLE I

Effect of ceramic coatings on tungsten leachability (in % of initial tungsten)

| Sample | Coating Time (hours) | Approx. Coating Thickness (nm) | % W 7-day | % W 14-day | % W 21-day | % W 28-day |
|---|---|---|---|---|---|---|
| Spheroidized W powder (uncoated control) | — | — | 0.43 | 0.54 | 0.59 | 0.75 |
| Coated Spheroidized W powder | 0.5 | 30 | 0.04 | 0.05 | — | — |

TABLE I-continued

Effect of ceramic coatings on tungsten leachability (in % of initial tungsten)

| Sample | Coating Time (hours) | Approx. Coating Thickness (nm) | % W 7-day | % W 14-day | % W 21-day | % W 28-day |
|---|---|---|---|---|---|---|
| Coated Spheroidized W powder | 2.0 | 200 | 0.00 | 0.08 | 0.11 | 0.13 |
| Coated Spheroidized W powder | 3.5 | 500 | 0.00 | 0.00 | 0.01 | 0.05 |

While there has been shown and described what are at the present considered the preferred embodiments of the invention, it will be obvious to those skilled in the art that various changes and modifications may be made therein without departing from the scope of the invention as defined by the appended claims.

What is claimed is:

1. A tungsten powder having a coating of a ceramic material that substantially encapsulates each individual tungsten particle, wherein the coating is hydrolyzed trimethylaluminum.

2. A tungsten powder having a coating of a ceramic material that substantially encapsulates each individual tungsten particle, wherein the coating is selected from aluminum oxide, aluminum oxyhydroxide, zirconium oxide, cerium oxide, hafnium oxide, and magnesium oxide.

3. The tungsten powder of claim 1, wherein the coating has a thickness of at least about 30 nm.

4. The tungsten powder of claim 1, wherein the coating has a thickness of from about 200 nm to about 500 nm.

5. The tungsten powder of claim 2, wherein the coating has a thickness of at least about 30 nm.

6. The tungsten powder of claim 2, wherein the coating has a thickness of from about 200 nm to about 500 nm.

* * * * *